Figure 1:
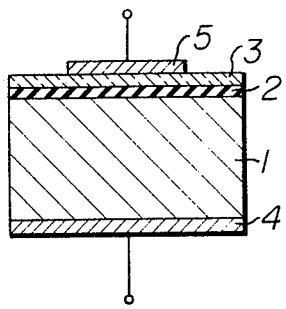

United States Patent [19]
Horiuchi et al.

[11] 3,967,310
[45] June 29, 1976

[54] SEMICONDUCTOR DEVICE HAVING CONTROLLED SURFACE CHARGES BY PASSIVATION FILMS FORMED THEREON

[75] Inventors: Masatada Horiuchi, Koganei; Takashi Tokuyama, Hoya; Takao Miyazaki, Hachioji, all of Japan

[73] Assignee: Hitachi, Ltd., Japan

[22] Filed: Nov. 30, 1973

[21] Appl. No.: 420,590

Related U.S. Application Data

[63] Continuation of Ser. No. 224,453, Feb. 8, 1972, abandoned, which is a continuation of Ser. No. 864,700, Oct. 8, 1969, abandoned.

[30] Foreign Application Priority Data
Oct. 9, 1968 Japan.............................. 43-73134
July 7, 1969 Japan.............................. 44-53035

[52] U.S. Cl.................................... 357/54; 357/23; 357/48; 357/52; 357/71
[51] Int. Cl.².................. H01L 27/04; H01L 29/78; H01L 29/94
[58] Field of Search ................. 357/54, 52, 23, 71

[56] References Cited
UNITED STATES PATENTS

| | | | |
|---|---|---|---|
| 3,386,163 | 6/1968 | Brennemann et al................. | 357/52 |
| 3,428,875 | 2/1969 | Snow .................................... | 357/54 |
| 3,457,125 | 7/1969 | Kerr..................................... | 148/187 |
| 3,571,914 | 3/1971 | Lands et al. .......................... | 357/54 |
| 3,590,272 | 6/1971 | Keshavan.............................. | 357/54 |
| 3,635,774 | 1/1972 | Ohta..................................... | 357/54 |
| 3,697,334 | 10/1972 | Yamamoto ........................... | 357/54 |

OTHER PUBLICATIONS

Snow et al., "Space-Charge Polarization in Glass Films," *Journal of Applied Physics*, vol. 37, No. 5, Apr. 1966, pp. 2123–2131.
Yamin, "Observations on Phosphorus Stabilized SiO₂ Films," *IEEE Trans. on Electron Dev.*, vol. ED13, No. 12, Feb. 1966, pp. 256–258.

*Primary Examiner*—William D. Larkins
*Attorney, Agent, or Firm*—Craig & Antonelli

[57] ABSTRACT

After desired impurities are diffused into a semiconductor substrate through a masking layer of $SiO_2$ formed thereupon so as to form a semiconductor device, the masking layer is completely removed therefrom and thereafter more than two thin layers of different insulating materials are deposited upon the cleaned surface of the semiconductor device thus providing a method of forming a semiconductor device with an improved passivation film thereon. Said insulating materials are selected from the group consisting of silicon dioxide, a silicon nitride, alumina, borosilicate glass, phospho-silicate glass, alumino-silicate glass, alumino-phospho-silicate glass and alumino-boro-silicate glass, and the thickness of each thin layer is in the range of 300 to 1500 angstroms and the first layer is silicon dioxide.

11 Claims, 18 Drawing Figures

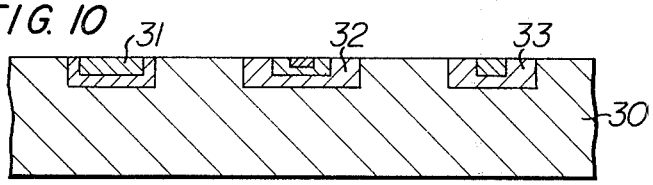
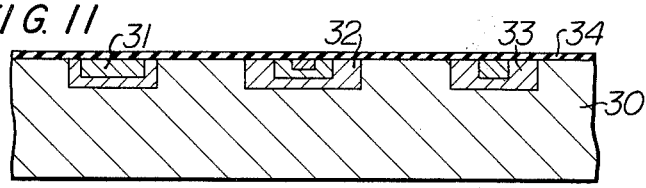
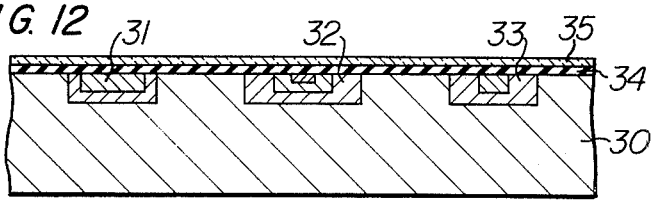
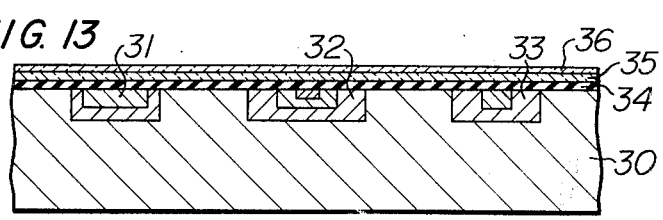
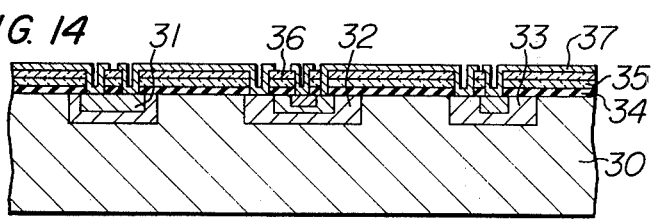

SEMICONDUCTOR DEVICE HAVING CONTROLLED SURFACE CHARGES BY PASSIVATION FILMS FORMED THEREON

This is a continuation of application Ser. No. 224,453 filed Feb. 8, 1972, now abandoned, which, in turn, is a continuation of application Ser. No. 864,700, filed Oct. 8, 1969, now abandoned.

This invention relates to a semiconductor device having electrical passivation films and to a method of making the same, and more particularly to a semiconductor device wherein the amount of the induced charges (called as n or p channels) generally produced on the surface of the semiconductor element by the electrical passivation films is controlled to a desired value and a method of making such a semiconductor device.

Conventionally, there have been used as electrical passivation films for a semiconductor a first insulating film consisting of $SiO_2$ and a second insulating film consisting of phospho-silicate glass, $Si_3N_4$, $Al_2O_3$ etc. $SiO_2$ has been used for the first insulating film because it has a remarkable effect in stabilizing the electrical characteristics and it is easy to construct and process. A second insulating film has been required because the $SiO_2$ film is weak against moisture and it must therefore be protected from the outer atmosphere. Another reason is that the $SiO_2$ film includes contamination ions therein and its influence must be reduced. More particularly, the phospho-silicate glass film usually applied as the second layer on the $SiO_2$ film fixes or getters contamination ions such as sodium ions in the $SiO_2$ film. The $Si_3N_4$ film etc. are used because of their effect of screening impurities.

A difficulty encountered in such a semiconductor device having electrical passivation films is that a large amount of induced charges (called channels) are generated on the semiconductor surface where the $SiO_2$ film is coated. The amount of the induced charges depends on the method of forming the $SiO_2$ film and the conditions of thermal treatments, but usually charges of the order of $3 \times 10^{11} - 10^{12}$ cm$^{-2}$ are induced in case where the semiconductor substrate is made of silicon. When excessive charges are induced, a p-type semiconductor substrate surface may be turned into an n-type or the surface of an n-type semiconductor substrate may be turned into an n$^+$ type. Thus, a large increase of junction capacitance or reverse current results in the case of a semiconductor device having a p-n junction. Therefore, it is desirable to make the amount of induced charges as small as possible. However, the desired electrical characteristics have not yet been obtained by said electrical passivation films because too many charges are induced.

In the case of a field effect transistor and more particularly an MOS field effect transistor, the induced charges on the semiconductor surface are utilized, though they are unfavorable in case of transistors, diodes, integrated circuits etc. More specifically, an MOS field effect transistor comprises a source and drain electrode regions formed in a semiconductor surface with a predetermined distance and the source and drain regions are connected by the charges induced by the insulating film. The amount of the induced charges (called surface charge density) is controlled by the gate electrode and thus the source-drain characteristic is controlled. Accordingly, the electrical characteristics of an MOS field effect transistor is greatly influenced by the amount of charges induced by an insulating film.

However, it has not been possible so far to obtain a desired amount of induced charges because the amount of the charges induced by conventional insulating films is too large.

A double film layer consisting of an $SiO_2$ film and a phospho-silicate glass film has recently been proposed to obviate the deficiencies described hereinabove. However, since the concentration of phosphorus is relatively high in phospho-silicate glass, the etching speed for the etchant usually employed for insulating films is high and fine processing is difficult due to such effects as undercutting etc.

Accordingly, an object of this invention is to provide an improved method of a semiconductor device having improved electrical characteristics and a device fabricated by such method.

Another object of this invention is to provide a semiconductor device wherein the surface charges induced by the passivation film are controlled and a method of making the same.

A further object of this invention is to provide a method of making a semiconductor device which comprises a passivation film which is scarcely undercut during etching.

A yet further object of this invention is to provide an electrical passivation film suitable for fine processing.

A still further object of this invention is to provide a semiconductor device having quite stable electrical characteristics and a method of making the same.

The present invention, which achieves these objects, is characterized in that a passivation film of $SiO_2$ is deposited on the surface of a semiconductor element having more than p-n junction inside as required, at least two layers of insulating films selected from silicon dioxide, silicon nitride, alumina, alumino-silicate glass, alumino-phospho-silicate glass, alumino-boro-silicate glass, phospho-silicate glass, and boro-silicate glass are deposited thereupon, the thickness of each insulating layer being 300 – 1500 A and adjacent film layers being formed of different materials, and thus charges having a type opposite to that of the surface charges induced by the $SiO_2$ film attached to the substrate surface are generated at the interface between the adjacent insulating layers and the amount of the surface charges is controlled to a predetermined value.

The principle of this invention is based on the discovery that charges are accumulated in the interface between insulating films when different kinds of insulating films are joined together.

This fact will be explained with reference to FIG. 1, which shows an MOS silicon element constructed to verify this fact experimentally. This element is fabricated in the following way, an $SiO_2$ film 2 of 1500 A in thickness is provided on one principal surface of a p conductivity type silicon substrate 1 of 50 Ω-cm in resistivity by thermal decomposition of $SiH_4$ and phospho-silicate glass 3 ($SiO_2/P_2O_5$) of 3000 A in thickness is formed thereupon by mixing $PH_3$ into $SiH_4$. Then metal electrodes 4 and 5 are attached to the side of the silicon substrate and the side of the insulating film, respectively, to form an MOS silicon element.

The capacitance-voltage (C-V) characteristics of the MOS element are studied to estimate the amount (denoted by $N_{FB}$) of surface charges induced on the silicon substrate surface contacting the $SiO_2$ film.

Now, the insulating film 3 is etched bit by bit from the surface and the value of $N_{FB}$ of the MOS element is measured at each step. When the $SiO_2/P_2O_5$ film 3 exists on the $SiO_2$ film 2, $N_{FB}$ is $2.5 \times 10^{-11}$ cm$^{-2}$ and nearly constant but when the $SiO_2/P_2O_5$ film 3 is completely eliminated and only the $SiO_2$ film 2 remains, the value of $N_{FB}$ rapidly increases to $7.5 \times 10^{-11}$ cm$^{-2}$. When the $SiO_2$ film is etched further, the $N_{BF}$ remains approximately constant at $7.5 \times 10^{-11}$ cm$^{-2}$.

It is inferred from the above experimental results that the charges in the insulating layer, which induce electrons or holes on the semiconductor surface, accumulate at the interface of the insulating layers. This discovery is a novel one because it was thought that the charges in the insulating film which form a channel are distributed uniformly in the film.

Figure 2:
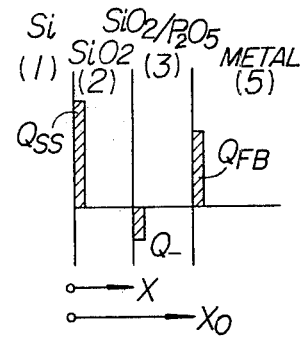

The charge distribution in the insulating film is described in FIG. 2 based upon the above experimental results. In the figure, $Q_{SS}$ denotes the amount of charges induced on the $SiO_2$ film side of the interface between the silicon substrate and the $SiO_2$ film 2, $Q$ denotes the amount of charges generated at the interface between the $SiO_2$ film 2 and the $SiO_2/P_2O_5$ film 3 and $Q_{FB}$ denotes charges added to the electrode side of the MOS element (FIG. 1) where they have such a value as to cancel charges induced on the surface of the silicon substrate. X indicates the distance between the surface of the silicon substrate and that of the $SiO_2$ film and Xo indicates the sum of the thicknesses of the $SiO_2$ film and of the $SiO_2/P_2O_5$ film.

Now, the reality of the conjecture described above is examined.

When an integral form of the Poisson equation is applied to FIG. 2, we obtain $$N_{FB} = \frac{X - Xo}{qXo} Q + \frac{Co}{q} \phi_{MS} - \frac{Q_{ss}}{q},$$

where $\phi_{MS}$ denotes a work function of silicon and electrode metal, denotes the charge of an electron, and Co denotes the capacitance of the double layer consisting of the $SiO_2$ film 2 and the $SiO_2/P_2O_5$ film 3. The dielectric constants of the $SiO_2$ film and the $SiO_2/P_2O_5$ film agree within experimental errors and are $4.0 \pm 0.2$. Thus, no influence is caused thereby.

Figure 3:
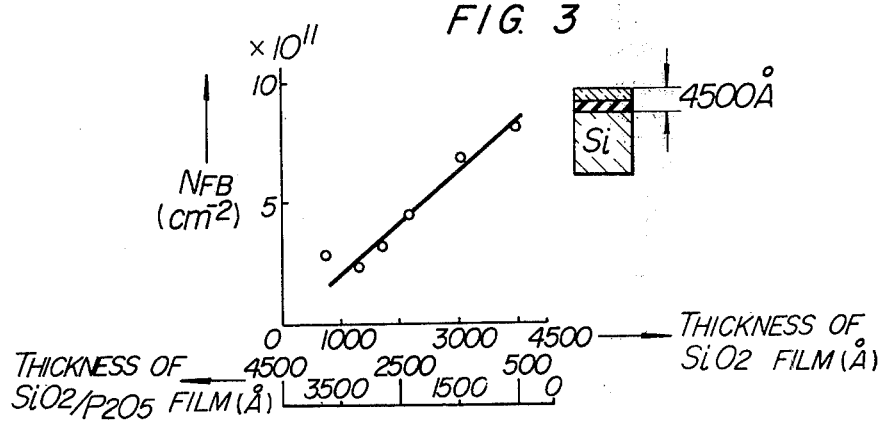

Now, the relation between the value of $N_{FB}$ and the thickness of the $SiO_2$ film is examined while keeping the sum of the thicknesses of the $SiO_2$ film and the $SiO_2/P_2O_5$ film of the MOS element shown in FIG. 1 constant at 4500 A. The results are shown in FIG. 3. The gradient of the figure is inserted into the above Poisson formula to obtain $Q_{SS}$. The result is $- (Q_{SS}/q) \simeq 21 \times 10^{11}$ cm$^{-2}$ and $$\frac{X - Xo}{Xo} \cdot \frac{Q}{q} \simeq 6.0 \times 10^{11} \text{ cm}^{-2},$$

which agree well with the value $5.0 \times 10^{11}$ cm$^{-2}$ obtained from the variation of $N_{FB}$ with etching. Thus, the existence of Q is verified algebraically.

It is also verified according to the experiment by the present Inventors that charges are accumulated at the boundary region between the films when insulating films are laminated not only in the above case, but also in cases of a combination of different kinds of films like a combination of $SiO_2$ film and boro-silicate glass ($SiO_2/B_2O_3$) film, one of $SiO_2/P_2O_5$ film and $SiO_2/B_2O_3$ film, $SiO_2$ film and $Al_2O_3$ film, $SiO_2$ film and aluminosilicate glass ($SiO_2/Al_2O_3$) film, etc.

The amount of charges induced on the semiconductor surface is determined by the amount of charges in an insulating film and the distance from the surface. Further, the charges formed at the boundary of the insulating film directly contacting the semiconductor surface are positive as shown in FIG. 2, while charges formed at the boundary between the insulating films are negative. Thus, the amount of charges influencing the semiconductor surface are the sum of charges corrected for the distance.

Accordingly, it is possible to compensate the amount of surface charges induced by the $SiO_2$ film by a large number of negative charges generated at the boundary if the $SiO_2$ film on the semiconductor surface is made as thin as possible and a large number of insulating films of different kinds are laminated on the surface. The amount of compensated charges is determined by the kind of the insulating films, the number of layers and the distance to the semiconductor surface.

In order to achieve the objects and the effect of this invention, it is desirable to make the insulating film as thin as possible and laminate as many insulating layers of different kinds as possible. In such a passivation film, undercutting or a phenomenon that a particular film is etched faster hardly occurs even if there exists a film for which the etching speed is high.

In this invention, it is desirable to laminate many passivation films, but when too many films are laminated, then, the distance from the semiconductor substrate becomes large and the charges at the boundary between the passivation films impose little effect on the induced charges on the semiconductor surface. Empirically, little effect is observed when the distance between the boundary and the semiconductor surface is larger than about 6000 A.

Further, it is desirable from the consideration of undercutting and the reasons described hereinabove that the passivation film is made as thin as possible and the thickness of the passivation film 2 lies in the range of 3000 – 300 A.

Figure 4:
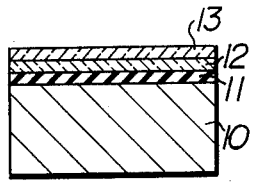
Figure 5:
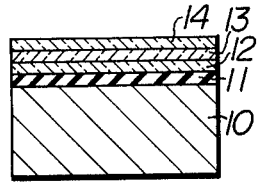
Figure 6:
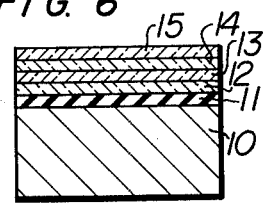
Figure 7:
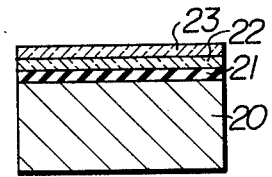
Figure 8:
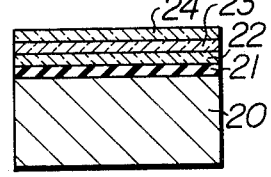
Figure 9:
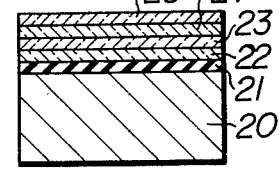
Figure 15:
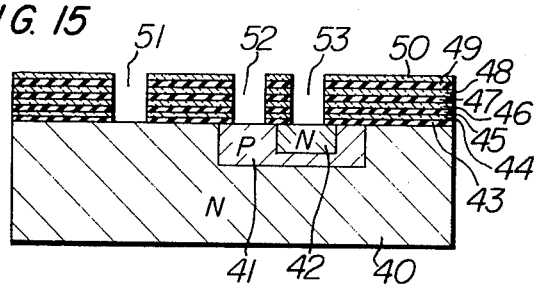
Figure 16:
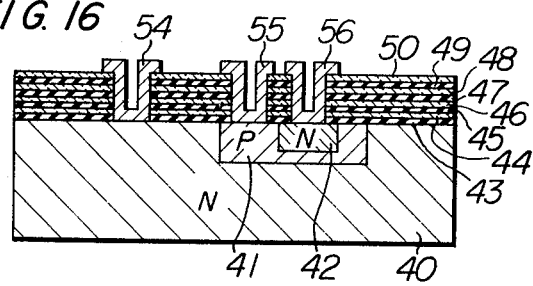
Figure 17:
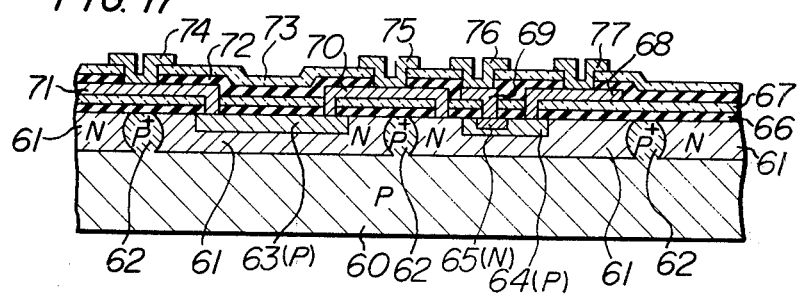
Figure 18:
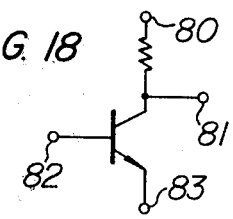

Now, this invention will be described with reference to the accompanying drawings, in which:

FIG. 1 is a longitudinal sectional diagram of an MOS element comprising known passivation films, FIG. 2 is a model diagram showing the charge distribution in passivation films, FIG. 3 is a diagram showing the relation between the amount of charges induced on the semiconductor surface and the thickness of the $SiO_2$ film when the thickness of the $SiO_2$ film is changed, FIGS. 4 to 6 are longitudinal sectional diagrams explaining an embodiment of this invention, FIGS. 7 to 9 are longitudinal sectional diagrams explaining another embodiment of this invention, FIGS. 10 to 14 show a further embodiment of this invention, FIGS. 15 to 16 are longitudinal sectional diagrams of a transistor according to a yet further embodiment of this invention, and FIGS. 17 and 18 show still further embodiments of this invention, wherein FIG. 17 is a longitudinal sectional diagram of an integrated circuit and FIG. 18 is an equivalent circuit diagram.

The features and advantages of this invention will become more apparent from the following description of some embodiments of this invention.

EMBODIMENT (1)

For convenience, this embodiment will be explained with reference to the drawings. However, it should be noted that the main parts are enlarged in the drawings. The amount of charges $N_{FB}$ induced on the semiconductor surface by depositing on insulating layer is determined by measuring the C-V characteristics.

FIGS. 4 to 6 show an embodiment of this invention. Reference numeral 10 denotes a p-type silicon substrate of 50 Ω.cm in resistivity and there are deposited on one principal surface thereof an $SiO_2$ film 11 of 1500 A in thickness formed by thermal decomposition of silane, an $SiO_2/B_2O_3$ film 12 of 1000 A in thickness obtained by mixing $BH_3$ vapor at the time of thermal decomposition of silane, and an $SiO_2/P_2O_5$ film 13 of 1000 A in thickness obtained by mixing $PH_3$ vapor at the time of thermal decomposition of silane.

The amount of induced charges (channel concentration) on the silicon substrate of an MOS structure obtained from this semiconductor sample turns out to be $1 \times 10^{11}$ cm$^{-2}$. When the $SiO_2/P_2O_5$ film 13 is not deposited, i.e. with a double layer of the $SiO_2$ film 11 and the $SiO_2/B_2O_5$ film 12, the amount of induced charges is $5 \times 10^{11}$ cm$^{-2}$. Thus, it is seen that the amount of induced charges on the semiconductor surface is reduced by employing a triple layer.

Now, when an $SiO_2/B_2O_3$ film 14 (in FIG. 5) of 1000 A in thickness is deposited on the $SiO_2/P_2O_3$ film 13 shown in FIG. 4, the surface charge density on the silicon surface is reduced to $1 \times 10^{10}$ cm$^{-2}$.

When an $SiO_2/P_2O_5$ film 15 (in FIG. 6) of 1000 A in thickness is deposited on the $SiO_2/B_2O_3$ film 14 shown in FIG. 5, the charge density on the silicon substrate surface becomes $0 - 1x \ 10^9$ cm$^{-2}$ which is undetectable from measurements of C-V characteristics, and such a situation is practically equivalent to a state where no charges are induced at all.

When the passivation films shown in FIGS. 4 to 6 are applied to a semiconductor device, not only are the surface charges induced by the passivation films but also stabilization of electrical characteristics must be established.

In order to study the stability of electrical characteristics of a semiconductor device having these passivation films, electrodes are provided on the insulating film side and the silicon substrate side of each MOS element shown in FIGS. 4 to 6 and B-T treatment (Bias-Temperature treatment) test is performed by exposing the MOS element at 250°C for thirty minutes while applying an electric field of $10^6$ V/cm. Then, the C-V characteristics are studied to measure the value of $N_{FB}$ on the semiconductor surface. It turns out that the value of $N_{FB}$ slightly increases after the B-T treatment test. In a known MOS element using a double layer of an $SiO_2$ film and an $SiO_2/B_2O_5$ film as a passivation film, the value increases by about 1.5 times that of the initial value.

It is proved by the B-T treatment test that the electrical characteristics of a semiconductor device of this invention are quite stable.

EMBODIMENT (2)

Now, another embodiment of this invention will be described.

In FIG. 7, reference numeral 20 denotes a p-type silicon substrate of 50 Ω-cm in resistivity. There are provided on one principal surface of the silicon substrate an $SiO_2$ film 21 of 1500 A in thickness formed by thermal decomposition of silane, an $SiO_2/P_2O_5$ film 22 of 1000 A in thickness obtained by mixing $PH_3$ vapor ($PH_3/SiH_4 = 1/10$) into silane vapor and an $SiO_2/B_2O_3$ film 23 of 1000 A in thickness obtained by mixing $B_2H_6$ vapor ($B_2H_6/SiH_4 = 1/10$) into silane vapor.

Electrodes are provided on the passivation film 23 and on the silicon substrate of such an element to form an MOS element and the density of induced charges on the silicon substrate surface just under the insulating film is measured from the C-V characteristics, which turns out to be about $5 \times 10^{11}$ cm$^{-2}$. When the $SiO_2/B_2O_3$ film 23 is not deposited, i.e. with a double layer consisting of the $SiO_2$ film 21 and the $SiO_2/P_2O_5$ film 22, the density of induced surface charges is $6 \times 10^{11}$ cm$^{-2}$.

It is seen from the above result that the density of induced charges in the semiconductor surface is reduced by employing such a triple layer.

When an $SiO_2/P_2O_5$ film 24 of 1000 A in thickness is deposited on the $Sio_2/B_2O_5$ film 23 as shown in FIG. 8, the density of induced charges on the silicon surface turns out to be $2 \times 10^{11}$ cm$^{-2}$.

Further, when an $SiO_2/B_2O_5$ film 25 of 1000 A in thickness is deposited on the $SiO_2/P_2O_5$ film 24 as shown in FIG. 9, the density of induced charges on the silicon substrate surface is $2.6 \times 10^{11}$ cm$^{-2}$. Thus, it is seen that a quadruple or pentagonal layer as shown in FIGS. 8 and 9 have a lower surface charge density than the triple layer shown in FIG. 7.

EMBODIMENT (3)

FIGS. 10 to 14 show longitudinal sectional diagrams for explaining the steps of making a semiconductor integrated circuit (SIC) according to an embodiment of this invention.

A resistor element 31, a transistor element 32 and a diode element 33 are provided in a semiconductor substrate 30 by known diffusion techniques. Then, the entire $SiO_2$ film used as a diffusion mask is etched away by HF etchant to expose the surface of the substrate 30 and the surface of the substrate 30 is cleaned by deionized pure water or distilled water. Then the element is dipped into an etchant of $HF/HNO_3 = \frac{3}{8}$ for several seconds and the surface thereof is slightly treated to improve its electrical characteristics. The surface is further cleaned by deionized pure water. (FIG. 10). Afterwards, the substrate 30 is transferred to a reaction furnace for monosilane ($SiH_4$) oxidation and mounted on a hot plate of 350° - 400°C in temperature and rotating at a speed of 20 - 40 rpm. Mixed gas of nitrogen diluted (4%) $SiH_4$ of 0.8 l/min, $N_2$ of 4.8 l/min and $O_2$ of 0.5 l/min is introduced into the neighborhood of the substrate 30 in the reaction furnace to induce the reaction,

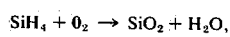

$$SiH_4 + O_2 \rightarrow SiO_2 + H_2O,$$

and a clean $SiO_2$ film 34 of about 0.2 μ (2000 A) in thickness is formed on the surface of the substrate 30 with a growth speed of 0.2 - 0.3 μ/min as shown in FIG. 11. Then, $B_2H_6$ gas is introduced into the reaction furnace so that the ratio of $SiH_4/B_2H_6$ may be 4 - 40 at 400° - 350°C to form a boro-silicate glass ($SiO_2/B_2O_3$) film 35 on the $SiO_2$ film 34 with a growth speed of 0.4 - 0.3 μ/min as shown in FIG. 12. Next, $PH_3$ gas is introduced so that the ratio of $SiH_4/PH_3$ may become 5 - 500 to form a phospho-silicate glass ($SiO_2/P_2O_5$) film 36 as shown in FIG. 13. Holes are then provided at those parts of the $SiO_2$ film 34, the $SiO_2/B_2O_3$ film 35 and the $SiO_2/P_2O_5$ film 36 which correspond to the electrode parts of each circuit element of the substrate 30. Metal 37 like aluminum is evaporated on all surfaces (FIG. 14) and unnecessary parts of the evaporation film are etched away according to a predetermined circuit structure to obtain a semiconductor integrated circuit (SIC).

When the substrate semiconductor has p-conductivity type as in the case of the SIC shown in FIG. 14, electrons are strongly induced on the substrate surface and n-type channels are formed on the surface of the substrate. In order to prevent an electrical short circuit or incomplete separation of the circuit elements due to the n-type channels, it is usually necessary to provide a p-type high impurity diffusion layer surrounding the circuit element. (This is already known as an annular ring in the field of interest.)

In an SIC according to this invention shown in FIG. 14, since the density of induced surface charges is low, it is not necessary to surround the circuit elements by a high p-type impurity diffusion layer.

Further, this invention has advantages caused by the fact that not only $SiO_2$ films contaminated by pretreatments like diffusion before forming a clean $SiO_2$ film are eliminated, but also the surface of the underlying Si substrate is slightly etched.

Namely, the part of the silicon surface contacting the $SiO_2$ film used as diffusion mask is a layer on which various impurities are deposited. This is ascribed to the fact that impurities in silicon or on the surface thereof are hardly included into the $SiO_2$ due to the difference in separating coefficient and the like when silicon is oxidized from the surface and this phenomenon invariably occurs irrespective of the species of the impurity. It is known that the surface recombination speed of hole-electron in a silicon surface increases due to the effect of the formation of trap levels by impurities etc. and the increase of reverse current at p-n junctions, the lowering of current amplification factors, the generation of noises etc. result. If the $SiO_2$ film used as diffusion mask is left, the circuit elements will suffer from these deficiencies, but these disadvantages can be overcome by eliminating the $SiO_2$ film because the surface part of the silicon substrate can be slightly etched off.

EMBODIMENT (4)

FIGS. 15 and 16 show the steps of making a transistor. An $SiO_2$ film is formed on the surface of an n-type silicon substrate 40 by high temperature oxidation, holes are provided at predetermined positions by photoetching and a p-type diffused layer 41 and an n-type diffused layer 42 are formed by diffusing a p-type impurity and then an n-type impurity by selective diffusing using the $SiO_2$ film as a mask. Then, the $SiO_2$ film used as a mask for impurity diffusion is completely etched away by a mixed solution of fluoric acid and nitric acid (etchant) and the silicon substrate surface is slightly etched.

Subsequently, an $SiO_2$ film of 1000 A in thickness and an $SiO_2/B_2O_3$ film of 500 A in thickness are alternately deposited by thermal decomposition of silane and by mixing $B_2H_6$ vapor into silane vapor, respectively. In the figure, 43, 45, 47, 49 denote $SiO_2$ films and 44, 46, 48, 50 denote $SiO_2/B_2O_3$ films.

Holes 51, 52, 53 are then provided in the insulating film of eight layers by photoetching techniques and the silicon surface is partially exposed. Then, aluminum is deposited on the holes to form electrodes 54, 55, 56 of a transistor, where 54 is a collector electrode, 55 is a base electrode and 56 is an emitter electrode.

The passivation films of the element shown in FIG. 16 are formed by making each layer as thin as possible and laminating many layers contrary to the conventional double layer. Thus, the density of induced charges on the semiconductor substrate surface is low and the electrical characteristics of the film is stable. Undercutting of a particular layer which is troublesome in conventional films hardly occurs because each layer is thin and holes can be made whose sizes agree accurately with the photoresist film of photoetching. The multi-layer passivation film according to this invention has stable electrical characteristics and is suitable for fine processing.

EMBODIMENT (5)

Now, a fundamental integrated circuit (IC) according to an embodiment of this invention formed by combining resistors and transistors will be described. IC's are usually formed of many active elements like transistors, diodes etc. and passive elements like resistors, capacitors etc., but it may be considered as a modified version of this embodiment.

FIG. 17 shows an integrated transistor and resistor.

In the figure, reference numeral 60 denotes a p-type silicon substrate, on one principal surface of which an n-type silicon epitaxial layer 61 is formed. A $p^+$ type layer 62 is formed in this epitaxial layer by selective diffusion (isolation diffusion) of a p type impurity and the epitaxial layer is divided into a plurality of electrically separated regions. Then, p type impurity diffused regions 63, 64 and an n type impurity diffused layer 65 are formed in the separated epitaxial layers by the selective diffusion of impurity. The p type impurity diffused layer 63 forms a resistor element of an IC, region 64 forms a base layer of the transistor, and the n type impurity diffused layer 65 forms an emitter layer of the transistor. The n type epitaxial layer 61, wherein the base layer 64 is formed, becomes a collector layer of the transistor.

In order to provide a passivation film on the surface of the IC element according to this invention, the $SiO_2$ film used as a mask in selectively diffusing an impurity into the semiconductor surface is completely etched away and the exposed semiconductor surface is slightly etched away. Then, the $SiO_2$ film 66 is provided on the surface of the IC element by the thermal decomposition of silane. After the $SiO_2$ film 66 of a predetermined thickness is obtained, the $SiO_2/P_2O_5$ film 67 is formed by mixing $PH_3$ vapor into silane vapor. After the double layer is obtained, holes are formed again at each electrode of the resistor and transistor. Then, aluminum is deposited all over the surface, and aluminum at undesired parts is eliminated by photoetching to form evaporation wiring or electrodes 68 to 71.

A known integrated circuit is fabricated in the way described hereinabove. According to this invention, an $SiO_2$ film 72 and an $SiO_2/B_2O_3$ film 73 are further formed on the double passivation films. They are formed by the known method. Then, holes are provided in the double layer of the $SiO_2$ film 72 and the $SiO_2/B_2O_3$ film 73 to form aluminum electrodes 74, 75, 76 and 77.

FIG. 18 is a circuit diagram of the IC shown in FIG. 17, wherein electrodes 80 to 83 correspond to the aluminum electrodes 74 to 77 in FIG. 17.

In this embodiment, the films 72 and 73 have the effect of stabilizing the evaporated wiring in addition to the effects of stabilizing the surface of the IC and reducing induced charges.

As has become apparent from the foregoing detailed description of the embodiments of this invention, this invention has the following advantages. (1) Different kinds of insulating films are formed on the surface of a semiconductor and the amount of induced surface charges is controlled by the charges at the boundary between the insulating layers. Accordingly, it is possible to readily obtain a semiconductor device which has a small density of surface charges. (2) Thinner insulating films are preferred to achieve the objects of this invention. Thus, undercutting does not occur in photoresist treatments of passivation films and the films are suited for fine processing. (3) The stability of electrical characteristics is good as verified by the B-T treatment test. (4) Since no step of passivation films as seen in a planar type transistor etc. is present in a passivation film of this invention, accidents like breaking of wiring electrodes, short circuit of wiring electrodes and underlying substrates due to pinholes etc. do not occur and reliability is high.

Though there have been described embodiments, wherein silicon is used as a semiconductor and $SiO_2$, $SiO_2/B_2O_3$ and $SiO_2/P_2O_5$ are used as passivation films, they are presented only as examples. It will be evident for those skilled in the art that other semiconductors like Ge, GaAs, GaP, InSb, InP etc. may be used and other known passivation films like $Al_2O_3$, $Si_3N_4$ etc. may also be used.

We claim:

1. A semiconductor device having controlled surface charges at the surface of a semiconductor substrate comprising:
    a. a semiconductor substrate having a pn junction extending to one surface thereof;
    b. a silicon dioxide film of about 300 to 1500 angstroms in thickness disposed upon the surface of said semiconductor substrate so that negative charges are induced by the film at the surface of the substrate;
    c. a first glass film having about 300 to 1500 angstroms in thickness and selected from one material of boro-silicate glass and phospho-silicate glass, said first glass film covering the passivation film so that negative charges are piled up at the interface of the passivation film and the first glass film, the density of the corresponding one material of boron and phosphorus in the first glass film being substantially uniform; and
    d. a second glass film having abut 300 to 1500 angstroms in thickness and selected from the other material of borosilicate glass and phospho-silicate glass, said second glass film covering the first glass film so that negative charges are piled up at the interface of the first glass and the second glass films, with the density of the corresponding other material of boron and phosphorus in the second glass film being substantially uniform, whereby the density of the charges induced by the passivation film at the surface of the semiconductor substrate is controlled by the charges induced at the respective interfaces, and further comprising a third glass film of said one material with a thickness of 300 to 1500 angstroms and covering the second glass so that the negative charges are piled up at the interface between the second glass film and the third glass film, the density of said one material in the third glass film being substantially uniform.

2. A semiconductor device as defined in claim 1, further comprising a fourth glass film of said other material with a thickness of 300 to 1500 angstroms and covering the third glass film, the density of said other material in the fourth glass film being substantially uniform.

3. A semiconductor device having controlled surface charges at the surface of a semiconductor substrate comprising:
    a semiconductor substrate having at least one pn junction extending to one surface thereof;
    a passivation film consisting entirely of silicon dioxide, having an upper surface and a lower surface and a thickness of from 300 to 1500 angstroms, disposed with the lower surface thereof contacting said one surface of said semiconductor substrate, thereby forming a discretely defined interface therewith and inducing negative charges at the surface of said substrate; and
    means, disposed on the upper surface of said silicon dioxide film, for controlling the total quantity of charges induced at the surface of said substrate, comprising:
    a first insulating film consisting entirely of a first insulating material having an upper surface and a lower surface, and a thickness in the range of from 300 to 1500 angstroms, with the lower surface of said first insulating film being disposed directly on the upper surface of said silicon dioxide film and forming a discretely defined interface therewith, with negative charges being accumulated at said interface between said first insulating film and said silicon dioxide film, and
    a second insulating film consisting entirely of a second insulating material different from said first insulating material having an upper surface and a lower surface, and a thickness in the range of from 300 to 1500 angstroms, with the lower surface of said second insulating film being disposed directly on the upper surface of said first insulating film and forming a discretely defined interface therewith, with negative charges being accumulated at the interface between said first and second insulating films,
    whereby the total quantity of charges induced at the surface of said substrate by the combination of said films is controlled,
    wherein said first insulating film consists entirely of phospho-silicate glass and said second insulating film consists entirely of boro-silicate glass.

4. A semiconductor device having controlled surface charges at the surface of a semiconductor substrate comprising:
    a semiconductor substrate having at least one pn junction extending to one surface thereof;
    a passivation film consisting entirely of silicon dioxide, having an upper surface and a lower surface and a thickness of from 300 to 1500 angstroms, disposed with the lower surface thereof contacting said one surface of said semiconductor substrate, thereby forming a discretely defined interface therewith and inducing negative charges at the surface of said substrate; and means, disposed on the upper surface of said silicon dioxide film, for controlling the total quantity of charges induced at the surface of said substrate, comprising:

a first insulating film consisting entirely of a first insulating material having an upper surface and a lower surface, and a thickness in the range of from 300 to 1500 angstroms, with the lower surface of said first insulating film being disposed directly on the upper surface of said silicon dioxide film and forming a discretely defined interface therewith, with negative charges being accumulated at said interface between said first insulating film and said silicon dioxide film, and a second insulating film consisting entirely of a second insulating material different from said first insulating material having an upper surface and a lower surface, and a thickness in the range of from 300 to 1500 angstroms, with the lower surface of said second insulating film being disposed directly on the upper surface of said first insulating film and forming a discretely defined interface therewith, with negative charges being accumulated at the interface between said first and second insulating films, whereby the total quantity of charges induced at the surface of said substrate by the combination of said films is controlled, further including a third insulating film consisting entirely of said first insulating film material having an upper surface and a lower surface, and a thickness in the range of from 300 to 1500 angstroms, with the lower surface of said third insulating film being disposed directly on the upper surface of said second insulating film and forming a discretely defined interface therewith, with negative charges being accumulated at the interface between said second and third insulating films.

5. A semiconductor device according to claim 4, wherein said first insulating film consists entirely of phospho-silicate glass and said second insulating film consists entirely of boro-silicate glass.

6. A semiconductor device according to claim 4, further including a fourth insulating film consisting entirely of said second insulating film material having an upper surface and a lower surface and a thickness in the range of from 300 to 1500 angstroms with the lower surface of said fourth insulating film being disposed directly on the upper surface of said third insulating film and forming a discretely defined interface therewith, with negative charges being accumulated at the interface between said third and fourth insulating films.

7. A semiconductor device according to claim 6, wherein said first insulating film consists entirely of boro-silicate glass and said second insulating film consists entirely of phospho-silicate glass.

8. A semiconductor device according to claim 6, wherein said first and second insulating materials are selected from the group consisting of silicon nitride, silicon dioxide, boro-silicate glass, phospho-silicate glass, alumina, alumino-silicate glass, alumino-phospho-silicate glass and alumino-boro-silicate glass.

9. A semiconductor device according to claim 6, wherein said first insulating film consists entirely of phospho-silicate glass and said second insulating film consists entirely of boro-silicate glass.

10. A semiconductor device according to claim 4, wherein said first and second insulating materials are selected from the group consisting of silicon nitride, silicon dioxide, boro-silicate glass, phospho-silicate glass, alumina, alumino-silicate glass, alumino-phospho-silicate glass and alumino-boro-silicate glass.

11. A semiconductor device according to claim 4, wherein said first insulating film consists entirely of boro-silicate glass and said second insulating film consists entirely of phospho-silicate glass.

* * * * *